(12) United States Patent
Takiar

(10) Patent No.: US 6,984,881 B2
(45) Date of Patent: Jan. 10, 2006

(54) STACKABLE INTEGRATED CIRCUIT PACKAGE AND METHOD THEREFOR

(75) Inventor: Hem P. Takiar, Sunnyvale, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/463,051

(22) Filed: Jun. 16, 2003

(65) Prior Publication Data

US 2004/0251523 A1 Dec. 16, 2004

(51) Int. Cl.
*H01L 23/02* (2006.01)

(52) U.S. Cl. .................. 257/685; 257/686; 257/777; 257/772

(58) Field of Classification Search ................ 257/685, 257/686, 777, 772; 438/109
See application file for complete search history.

(56) References Cited

U.S. PATENT DOCUMENTS

| | | | |
|---|---|---|---|
| 4,920,074 A | * | 4/1990 | Shimizu et al. ............... 29/827 |
| 5,041,901 A | | 8/1991 | Kitano et al. |
| 5,221,858 A | * | 6/1993 | Higgins, III ................ 257/666 |
| 5,291,061 A | | 3/1994 | Ball |
| 5,331,235 A | | 7/1994 | Chun |
| 5,422,435 A | | 6/1995 | Takiar et al. |
| 5,495,398 A | | 2/1996 | Takiar et al. |
| 5,502,289 A | | 3/1996 | Takiar et al. |
| 5,596,225 A | | 1/1997 | Mathew et al. |
| 5,617,297 A | | 4/1997 | Lo et al. |
| 5,625,221 A | | 4/1997 | Kim et al. |
| 5,629,563 A | | 5/1997 | Takiar et al. |
| 5,677,567 A | | 10/1997 | Ma et al. |
| 5,776,797 A | | 7/1998 | Nicewarner, Jr. et al. |
| 5,804,880 A | | 9/1998 | Mathew |
| 5,986,209 A | * | 11/1999 | Tandy ...................... 174/52.4 |
| 6,072,233 A | | 6/2000 | Corisis et al. |
| 6,080,264 A | | 6/2000 | Ball |
| 6,137,163 A | | 10/2000 | Kim et al. |
| 6,301,121 B1 | | 10/2001 | Lin |
| 6,303,997 B1 | | 10/2001 | Lee |

(Continued)

FOREIGN PATENT DOCUMENTS

JP 4-321261 * 11/1992 ................ 257/666

OTHER PUBLICATIONS

Eric Bogatin, *Roadmaps of Packaging Technology*, published by Integrated Circuit Engineering Corporation, 1997, Chapter 13, "Next Generation Technologies," pp. 13–1 thru 13–34.

(Continued)

*Primary Examiner*—Jasmine Clark
(74) *Attorney, Agent, or Firm*—Beyer Weaver & Thomas, LLP

(57) ABSTRACT

Improved apparatus and methods for stacking integrated circuit packages having leads are disclosed. According to one embodiment, the leads of an integrated circuit package are exposed and provided with solder balls so that corresponding leads of another integrated circuit package being stacked thereon can be electrically connected. The stacking results in increased integrated circuit density with respect to a substrate, yet the stacked integrated circuit packages are able to still enjoy having an overall thin or low profile.

23 Claims, 6 Drawing Sheets

U.S. PATENT DOCUMENTS

| | | | |
|---|---|---|---|
| 6,323,060 B1 | 11/2001 | Isaak | |
| 6,378,758 B1 | 4/2002 | Haba | |
| 6,437,433 B1 | 8/2002 | Ross | |
| 6,455,928 B2 * | 9/2002 | Corisis et al. | 257/686 |
| 6,458,617 B1 | 10/2002 | Liao et al. | |
| 6,476,475 B1 | 11/2002 | Lee | |
| 6,482,677 B2 | 11/2002 | Sato et al. | |
| 6,577,012 B1 | 6/2003 | Greenwood et al. | |
| 6,674,173 B1 | 1/2004 | Wang | |
| 6,677,181 B2 | 1/2004 | Park et al. | |
| 2001/0013645 A1 | 8/2001 | King et al. | |
| 2002/0149091 A1 * | 10/2002 | Palmteer et al. | 257/667 |
| 2002/0158325 A1 | 10/2002 | Yano et al. | |
| 2003/0011068 A1 | 1/2003 | Song et al. | |
| 2003/0197260 A1 * | 10/2003 | Nishimura et al. | 257/686 |

OTHER PUBLICATIONS

Al–sarawi et al., "A Review of 3–D Packaging Technology," IEEE Transactions on Components, Packaging, and Manufacturing Technology, Part B, vol. 21, No. 1, Feb. 1998, pp. 2–14.

"MicroLeadFrame Package," data sheet, Amkor Technology, Inc., 2 pages.

*Application Notes for Surface Mount Assembly of Amkor's MicroLeadFrame (MLF)Packages*, Amkor Technology, Inc., Rev. C, Sep. 2002, pp. 1–18.

"Flip Chip MicroLeadFrames (fcMLF) Package," data sheet, Amkor Technology, Inc., 2 pages.

"RF Wireless," fact sheet, Amkor Technology, Inc., 1 page.

"Amkor Expanding MicroLeadFrame Capacity to Meet Market Demand," press release, Amkor Technology, Inc., Sep. 23, 2002, 2 pages.

"Amkor Starts Producing Saw–Singulated QFN Packages," press release, Amkor Technology, Inc., Nov. 12, 2001, 2 pages.

"MicroLeadFrame (MLF)," product data sheet, Amkor Technology, Inc., 3 pages, downloaded from http://www.amkor.com/products/All_Products.MLF.cfm on Dec. 3, 2002.

"MLF Packaging Process," informational slides, Amkor Technology, Inc., 4 sheets.

"Automotive/Thermal Enhanced Power Products," informational slides, Amkor Technology, Inc., 2000, 16 sheets.

Hara, "Sharp package stacks chips in system integration play," EE Times, Jul. 30, 1999, 4 pages.

Sharp IC Packaging Services by Sharp Foundry, product information data sheet, Sharp Microelectronics of the Americas, downloaded from http://www.sharpsma.com/foundry/ic–packaging.htm on Feb. 5, 2003.

Sharp SMA Stacked CSP, website product information sheet (downloaded Dec. 6, 2002 from http://www.sharpsma.com/sma/products/memory/Packages/Stacked_CSP.htm) pp. 1–2.

Sharp Combination Memories (Stacked CSP), website product datasheet (downloaded Dec. 17, 2002 from http://sharp-world.com/products/device/flash/cmlist.html), pp. 1–3.

Kada et al., "Advancements in Stacked Chip Scale Packaging (S–CSP), Provides System–in–a–Package Functionality for Wireless and Handheld Applications," Proceedings of Pan Pacific Microelectronics Symposium Conference, Jan. 2000, pp. 1–7.

Sharp SMA Flash Memories CSP, website product information sheet (downloaded Dec. 6, 2002 from http://www-.sharpsma.com/sma/products/memory/Packages/CSP.htm.), pp. 1–2.

John H. Day, "Packaging Options Stack Up for Stacking Active Devices," EE Times, Oct. 4, 2001, pp. 1–4.

LRS13023: Stacked Chip 8M Flash and 1M SRAM, Sharp Integrated Circuits Group, product specification, Spec. No. EL116039, Jun. 11, 1999, pp. 1–60.

International Search Report dated may 25, 2005 re International Application No. PCT/US2004/018020.

Written Opinion of the International Searching Authority dated May 24, 2005 re International Application No. PCT/US2004/018020.

* cited by examiner

US 6,984,881 B2

STACKABLE INTEGRATED CIRCUIT PACKAGE AND METHOD THEREFOR

CROSS-REFERENCE TO RELATED APPLICATION

This application is related to U.S. patent application Ser. No. 10/463,742, filed concurrently herewith, and entitled "INTEGRATED CIRCUIT PACKAGE HAVING STACKED INTEGRATED CIRCUITS AND METHOD THEREFOR", and which is hereby incorporated by reference herein.

BACKGROUND OF THE INVENTION

1. Field of the Invention

The present invention relates to integrated circuit packages and, more particularly, to integrated circuit packages that are stackable.

2. Description of the Related Art

As the trend for memory integrated circuit (IC) packages to be smaller and their memory density to be larger continues, advancements in packaging integrated circuits are needed. One recent advancement involves stacking multiple integrated circuit dies within a single IC package. Such internal package stacking involves stacking a smaller die on a larger die. Each of the dies is wire bonded to a substrate. This type of stacking has, for example, been used with same function dies (e.g., two Flash memory dies) or different function dies (e.g., one Flash memory die and one SRAM die). Stacking of two or three dies has been done for stacked Chip Scale Packages (stacked CSP) and stacked Thin Small Outline Packages (TSOP).

Besides stacking of dies within a single IC package, IC packages can themselves be stackable. Conventionally, special connectors or modules are needed to stack integrated circuit packages. Unfortunately, however, the cost technologies. Accordingly, there is a need for improved stacking technologies for integrated circuit packages that are not dependent on special connectors or modules.

SUMMARY OF THE INVENTION

Broadly speaking, the invention relates to improved apparatus and methods for stacking integrated circuit packages having leads. According to one embodiment, the leads of an integrated circuit package are exposed and provided with solder balls so that corresponding leads of another integrated circuit package being stacked thereon can be electrically connected. The stacking results in increased integrated circuit density with respect to a substrate, yet the stacked integrated circuit packages are able to still enjoy having an overall thin or low profile.

The improved apparatus and methods are particularly useful for stacking same size (and often same function) integrated circuit packages. One example of a use for such integrated circuit packages is a non-volatile memory integrated circuit product that contains a stack of two or more like-sized memory storage integrated circuit packages.

The invention can be implemented in numerous ways, including as a system, apparatus, device or method. Several embodiments of the invention are discussed below.

As a stackable integrated circuit package, one embodiment of the invention includes at least: a leadframe having an inner region and an outer region, the outer region having a plurality of electrically conductive leads, and each of the conductive leads having a non-solderable region and a solderable region; at least one die electrically connected to the inner region of the leadframe; and an encapsulant material surrounding at least most of the inner region of the leadframe and the at least one die, thereby forming the stackable integrated circuit package with at least the solderable region of the conductive leads at the outer region of the leadframe being exposed.

As a memory card providing non-volatile data storage, one embodiment of the invention includes at least a first stackable integrated circuit package having a top surface and a bottom surface, and a second stackable integrated circuit package having a top surface and a bottom surface. The second stackable integrated circuit package is stacked on the first stackable integrated circuit chip. The first stackable integrated circuit package includes at least: a first leadframe having an inner region and an outer region, the outer region having a plurality of electrically conductive leads, and each of the conductive leads having a non-solderable region and a solderable region; at least one die electrically connected to the inner region of the first leadframe; an encapsulant material surrounding at least most of the inner region of the first leadframe and the at least one die, thereby forming the first stackable integrated circuit package with at least the solderable region of the conductive leads at the outer region of the first leadframe being exposed; and first solder balls provided on the solderable region of each of the conductive leads. The second stackable integrated circuit package includes at least: a second leadframe having an inner region and an outer region, the outer region having a plurality of electrically conductive leads, and each of the conductive leads having a non-solderable region and a solderable region; at least one die electrically connected to the inner region of the second leadframe; an encapsulant material surrounding at least most of the inner region of the leadframe and the at least one die, thereby forming the second stackable integrated circuit package with at least the solderable region of the conductive leads at the outer region of the second leadframe being exposed; and second solder balls provided on the solderable region of each of the conductive leads. When the second stackable integrated circuit package is stacked on the first stackable integrated circuit chip, the second solder balls electrically connect the conductive leads of the second stackable integrated circuit package to corresponding ones of the conductive leads of the first stackable integrated circuit package.

As a method for forming a stackable integrated circuit package, one embodiment of the invention includes at least the acts of: obtaining a metal leadframe having a plurality of conductive leads; attaching a first die to an inner region of the metal leadframe; electrically connecting the first die to an outer region of the metal leadframe using conductive links; encapsulating the first die, the conductive links, and most of the metal leadframe, such that a peripheral portion of the conductive leads at the outer region of the metal leadframe is not encapsulated; and attaching a solder deposit to each of the conductive leads at the outer region of the metal leadframe.

As an electronic device, one embodiment of the invention includes at least a printed circuit board; a first stackable integrated circuit package, and a second stackable integrated circuit package. The first stackable integrated circuit package has first extended conductive leads, each of the first extended conductive leads having a non-solderable region and a solderable region, and has first solder deposits at the solderable region of each of the first extended conductive leads. The second stackable integrated circuit package has second extended conductive leads, each of the second extended conductive leads having a non-solderable region and a solderable region, and has second solder deposits at the solderable region of each of the second extended conductive leads. The first stackable integrated circuit package is mounted on the printed circuit board, and the first solder de posits are used to at least electrically couple the first extended conductive leads of the first stackable integrated circuit package to the printed circuit board. The second stackable integrated circuit package is stacked on the first stackable integrated circuit package, and the second solder deposits are used to at least electrically couple the second extended conductive leads of the second stackable integrated circuit package to respective ones of the first extended conductive leads of the first stackable integrated circuit package. Hence, the second extended conductive leads of the second stackable integrated circuit package electrically couple (and possibly mechanically couple) to the printed circuit board via the first extended conductive leads of the first stackable integrated circuit package.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals design ate like structural elements, and in which.

DETAILED DESCRIPTION OF THE INVENTION

The invention relates to improved apparatus and methods for stacking integrated circuit packages having leads. According to one embodiment, the leads of an integrated circuit package are exposed and provided with solder balls so that corresponding leads of another integrated circuit package being stacked thereon can be electrically connected. The stacking results in increased integrated circuit density with respect to a substrate, yet the stacked integrated circuit packages are able to still enjoy having an overall thin or low profile.

The improved apparatus and methods are particularly useful for stacking same size (and often same function) integrated circuit packages. One example of a use for such integrated circuit packages is a non-volatile memory integrated circuit product that contains a stack of two or more like-sized memory storage integrated circuit packages.

Embodiments of this aspect of the invention are discussed below with reference to FIGS. 1A–7B. However, those skilled in the art will readily appreciate that the detailed description given herein with respect to these figures is for explanatory purposes as the invention extends beyond these limited embodiments.

Figure 1A:
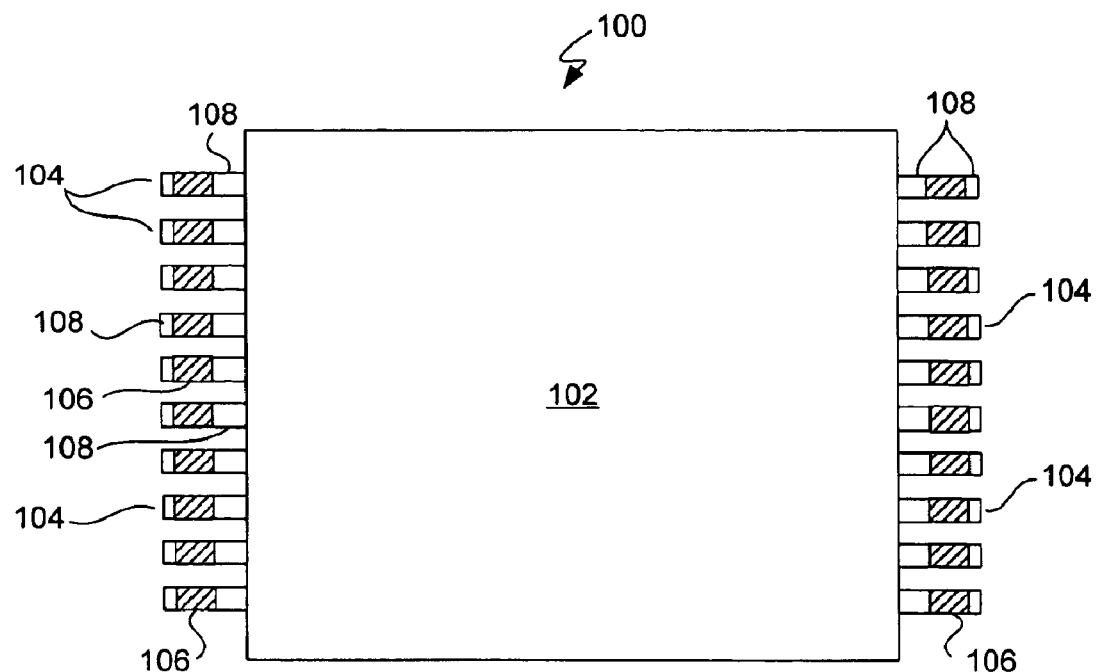
FIG. 1A is a top view of an integrated circuit package according to one embodiment of the invention.

FIG. 1A is a top view of an integrated circuit package 100 according to one embodiment of the invention. The integrated circuit package 100 includes a package housing 102 that has a plurality of conductive leads 104 that extend outward therefrom. The conductive leads 104 represent an outer portion of a leadframe whose inner portion resides within the package housing 102. In addition, the package housing 102 encapsulates at least one integrated circuit die that is electrically coupled to the inner region of the leadframe. Hence, the conductive leads 104 provide electrical connection to the at least one integrated circuit die within the package housing 102.

One feature of the integrated circuit package 100 is that it is stackable. In other words, different ones of the integrated circuit packages 100 can be stacked upon each other. Typically, the integrated circuit packages 100 are stacked vertically one on top of another; however, the orientation of the stack need not be vertical. Additional details on stacking the integrated circuit packages 100 will be described in more detail below. Nevertheless, to facilitate such stacking, the conductive leads 104 of the integrated circuit package 100 are designed to have a solderable region 106 and a non-solderable region 108. The non-solderable region 108 of each of the conductive leads 104 can pertain to a single area or multiple areas. For example, as shown in FIG. 1A, each of the conductive leads 104 has a non-solderable area 108 on each side of the solderable region 106. In one embodiment, the leads 104 are conductive since they are part of the leadframe. For example, the leadframe and thus the conductive leads 104 can be made of a conductive metal, such as copper or gold.

The solderable region 106 and the non-solderable regions 108 for each of the conductive leads 104 can be formed or provided in a number of different ways. In one implementation, the solderable region 106 on the conductive leads 104 can simply represent a portion of the conductive lead 104 itself; provided that the conductive lead 104 is made of a material that is both conductive and solderable. In such an implementation, to render the non-solderable regions of the conductive leads 104 non-solderable, a non-solderable material is applied to the non-solderable regions 108. As one example, the non-solderable material can be a layer of metal (e.g., aluminum, copper or nickel, or metal alloy) that is non-solderable and that would be provided (e.g., deposited) at the non-solderable regions 108 of the conductive leads 104. In another example, the non-solderable material can be a dielectric, such as a molding compound. The molding compound is also known as an encapsulant material. In that case in which a molding compound is used to provide the non-solderable regions 108, the molding compound can, as an example, be the same as and/or contiguous with the molding compound of the package housing 102. The conductive leads 104 remain electrically conductive despite the use of non-solderable regions 108.

Although FIG. 1A pertains to a top view of the integrated circuit package 100, it should be recognized that, typically, both top and bottom surfaces of the conductive leads 104 would include similar solderable regions and non-solderable regions. Furthermore, although the integrated circuit package 100 shown in FIG. 1A has the conductive leads 104 at two of its four sides, it should be noted that, in general, the integrated circuit package 100 can have the conductive leads 104 at one or more of its sides.

Figure 1B:
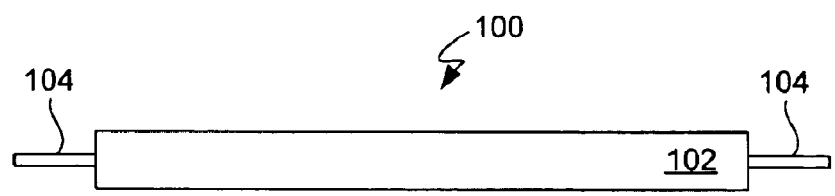
FIG. 1B is a side view of the integrated circuit package shown in FIG. 1A according to one embodiment of the invention.

FIG. 1B is a side view of the integrated circuit package 100 shown in FIG. 1A according to one embodiment of the invention. In this embodiment, the leads 104 are centrally provided with respect to the package housing 102. In other embodiments, the leads can be provided in other vertical positions with respect to the package housing 102. For example, the leads 104 could be aligned with the bottom or top of the package housing 102. Regardless of the position of the leads, the integrated circuit package is thin and thus has a low profile. As an example, the height (or thickness) of the integrated circuit package 100 is about 0.5–1.5 millimeter (mm). The length and width of the integrated circuit package 100 can vary widely, such as from a small size of 5×5 mm to a large size of 35×35 mm, for example. For example, the integrated circuit package 100 can be referred to, in one embodiment, as a leadframe Chip Scale Package (leadframe CSP). Examples of leadframe CSP include Quad Flat No-lead (QFN) and Small Outline No-lead (SON) packages.

Figure 2A:
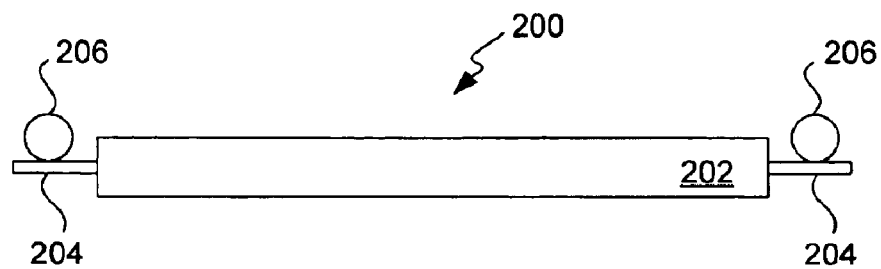
FIG. 2A is a diagram of a side view of an integrated circuit package according to one embodiment of the invention.

FIG. 2A is a diagram of a side view of an integrated circuit package 200 according to one embodiment of the invention. The integrated circuit package 200 shown in FIG. 2A is similar to the integrated circuit package 100 shown in FIG. 1B. More specifically, the integrated circuit package 200 shown in FIG. 2A includes a package housing 202 with conductive leads 204 that extend from the package housing 202. Additionally, a solder ball 206 is provided on each of the conductive leads 204 that extend out from the package housing 202. The solder balls 206 are used to electrically connect the conductive leads 204 of the integrated circuit package 200 to a substrate (e.g., printed circuit board) or another same or similar integrated circuit package (e.g., when being stacked). In one implementation, the conductive leads 204 have a height (thickness) of about 100–250 microns—mm, the solder balls have a diameter of about 0.5–1.5 mm, and the height (thickness) of the overall integrated circuit package 200 is in the range of 0.5–1.5 mm. In one embodiment, the diameter of the solder balls, more particularly, the height of the solder balls, is similar to the height (thickness) of the overall integrated circuit package 200.

Figure 2B:
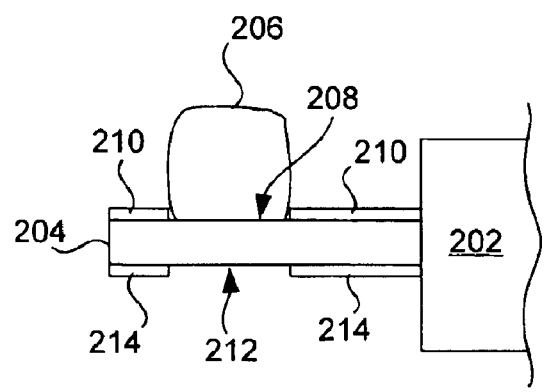
FIG. 2B is an exploded view of one of the conductive leads of the integrated circuit package shown in FIG. 2A.

FIG. 2B is an exploded view of one of the conductive leads 204 of the integrated circuit package 200 shown in FIG. 2A. In the exploded view, one of the conductive leads 204 is depicted extending outward from the package housing 202. The conductive lead 204 is shown having a solder ball 206 provided on the top surface of the conductive lead 204. More particularly, the solder ball 206 is adhered to a solderable region 208 of the top surface of the conductive lead 104. On the other hand, to provide a non-solderable region on the top surface of the conductive lead 204, a layer of non-solderable material 210 is provided on the top surface of the conductive lead 204 in the areas pertaining to the non-solderable region. As an example, the layer of non-solderable material 210 can be metal or metal alloy that is electrically conductive but non-solderable (e.g., an aluminum, copper or nickel). As another example, the layer of non-solderable material 210 can be an organic material.

The beneficial impact of the non-solderable region is that when the solder ball 206 is heated to a molten state, the solder ball 206 will not flow onto the non-solderable region and thus would substantially retain its shape as a ball of solder. Although the solder ball 206 might deform slightly from a ball-like shape (see FIG. 2B) when heated to a molten state, the overall height of the solder ball 206 remains substantially the same. If the non-solderable region were not present, the solder ball 206 would reflow across the top surface of the conductive lead 204 and thus would lose all of its characteristics as a ball and would have a resulting height that is dramatically diminished from its original height.

It should also be noted that the bottom side of the conductive lead 204 is similarly constructed such that it has a solderable region 212 and a non-solderable region. The non-solderable region is formed by providing a layer of non-solderable material on the bottom surface of the conductive lead 204 in areas pertaining to the non-solderable region. In the embodiment shown in FIG. 2B, the solderable area 212 does not include a solder ball, as typically each of the conductive leads 204 have a solder ball provided on either the top surface or the bottom surface. Nevertheless, in the case in which the integrated circuit packages 200 are stacked on one another, the solder ball 206 from one package can be used to connect to the conductive lead 204 of another integrated circuit package at the solderable region 212.

Figure 3:
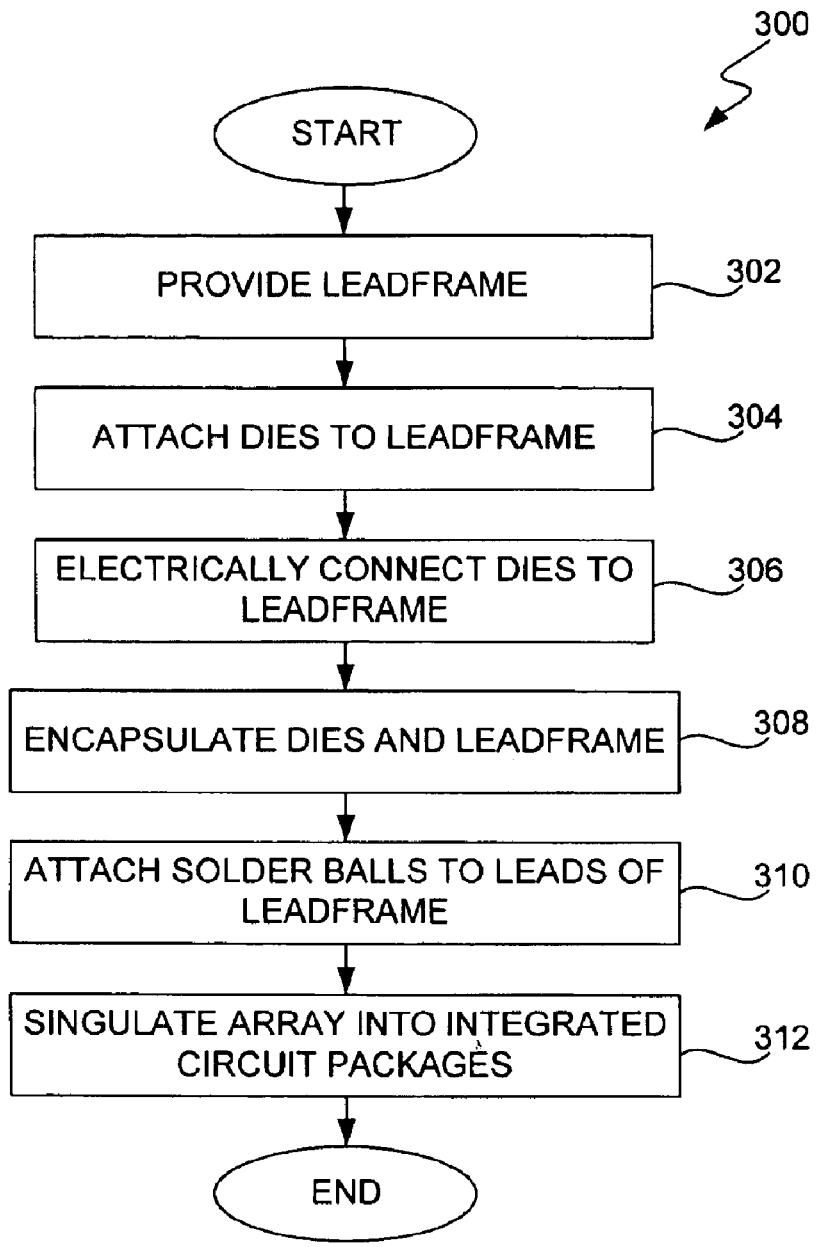
FIG. 3 is a flow diagram of integrated circuit package formation processing according to one embodiment of the invention.

FIG. 3 is a flow diagram of integrated circuit package formation processing 300 according to one embodiment of the invention. The integrated circuit package formation processing 300 initially begins with a leadframe being provided 302. Typically, the leadframe is an array of individual leadframes that are formed in a sheet so that a plurality of integrated circuit packages can be concurrently produced. Hence, with respect to FIG. 3, the leadframe can be considered to pertain to an array of individual leadframes.

After the leadframe has been provided 302, dies (integrated circuit chips) are attached 304 to the leadframe. Here, each leadframe instance within a leadframe array would receive one or more dies and such one or more dies would be connected to the particular leadframe instance. The dies can be attached 304 to the leadframe in various ways. For example, for a given leadframe instance, a die might be attached using an adhesive. In such an example, the given leadframe instance can be attached either directly to the leadframe, or indirectly to the leadframe via an intermediate die attach pad that might be provided between the die and the leadframe. The dies are then electrically connected 306 to the leadframe. Here, the electrical connection can be provided in a number of different ways. In one implementation, the dies are wire-bonded to the leadframe. In another implementation, solder balls connect the dies to the leadframe.

Next, the dies and the leadframe are encapsulated 308. The encapsulation of the dies and the leadframe forms a package body (or housing) that protects the dies, the electrical connections and the leadframe. A molding compound or encapsulant material is used to form the package body. Even so, the peripheral leads of the leadframe for each of the leadframe instances within the array remain exposed. These exposed leads then have solder balls attached 310 thereto. Since the exposed leads are formed as described above, the solder balls are able to substantially retain their shape, even when in a molten state.

At this point, a plurality of the integrated circuit packages have been prepared and are present on the array of individual leadframes. Now, the array is singulated 312 into separate integrated circuit packages. The singulation can vary depending upon particular applications and integrated circuit package types. For example, the singulation can be achieved through mechanical punching operations and/or sawing operations. After the integrated circuit packages are separated from the array structure, the integrated circuit package formation processing 300 is complete and ends.

Figure 4:
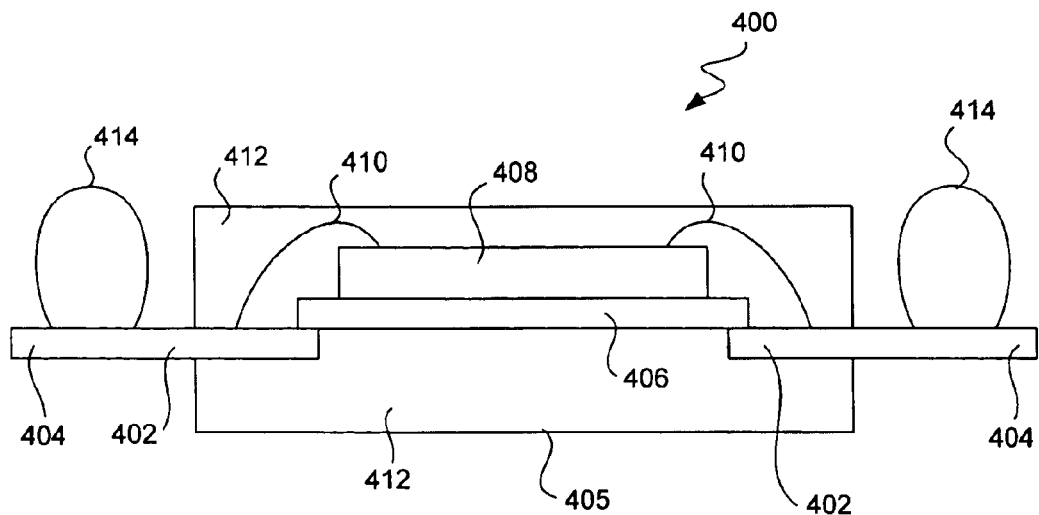
FIG. 4 is a cross-sectional view of an integrated circuit package according to one embodiment of the invention.

FIG. 4 is a cross-sectional view of an integrated circuit package 400 according to one embodiment of the invention. The integrated circuit package 400 is a single die implementation of one embodiment of the invention. For example, the integrated circuit package 400 can represent one implementation of the integrated circuit package 200 shown in FIG. 2A. The formation of the integrated circuit package 400 can, for example, be done in accordance with the integrated circuit package formation processing 300 described above with respect to FIG. 3. More particularly, the integrated circuit package 400 is constructed around a leadframe 402 (block 302). Here, the leadframe 402 pertains to an individual leadframe instance of an array of individual leadframes. The leadframe 402 can be considered to include an inner region and an outer region. The outer region contains primarily the leads 404 which extend beyond a package body 405 of the integrated circuit package 400. A die 408 is attached to the leadframe 402 by way of a die attach pad 406 (block 304). The die attach pad 406 can be attached to the inner region of the leadframe 402 by an adhesive, and the die 408 can be attached to the die attach pad 406 with an adhesive. The die 408 is electrically connected to the leadframe 402 using wire bonds 410 (block 306). A molding compound 412 forms the package body 405 and encapsulates the inner region of the leadframe 402, the die attach pad 406, the die 408 and the wire bonds 410 (block 308). Thereafter, solder balls 414 are provided on the leads 404 of the leadframe 402 (block 310). The integrated circuit package 400 represents a single instance that might be concurrently formed in an array fashion and then singulated at the end of the processing, thereby forming the individualized integrated circuit packages (block 312).

Figure 5:
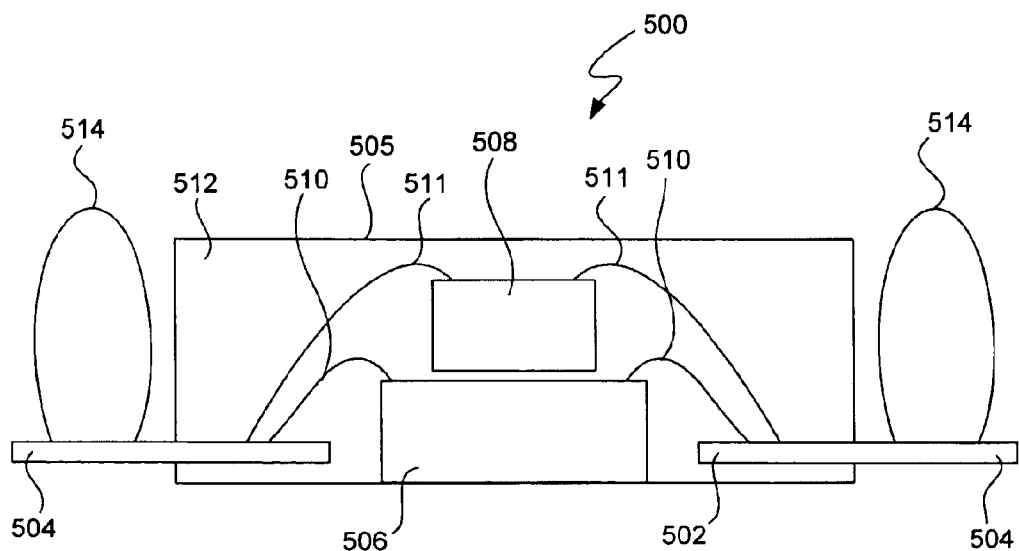
FIG. 5 is a cross-sectional view of an integrated circuit package according to another embodiment of the invention.

FIG. 5 is a cross-sectional view of an integrated circuit package 500 according to another embodiment of the invention. The integrated circuit package 500 includes a plurality of dies, one being stacked on top of another, within the integrated circuit package 500. For example, the integrated circuit package 500 can represent one implementation of the integrated circuit package 200 shown in FIG. 2A, though the vertical position of the leadframe is different. The formation of the integrated circuit package 500 can, for example, also be done in accordance with the integrated circuit package formation processing 300 described above with respect to FIG. 3. More particularly, the integrated circuit package 500 is constructed around a leadframe 502 (block 302). Here, the leadframe 502 pertains to an individual leadframe instance of an array of individual leadframes. The leadframe 502 can be considered to include an inner region and an outer region. The outer region contains primarily the leads 504 which extend beyond a package body 505 of the integrated circuit package 500. A first die 506 can have a surface exposed at a first surface of the integrated circuit package 500. The first die 506 can be attached to the leadframe 502 with or without use of a die attach pad (not shown). The first die 506 is electrically connected to the leadframe 502 using wire bonds 510 (block 306). A second die 508 is stacked on the first die 506. The second die 508 can, for example, be attached to the first die 506 by an adhesive and/or by a die attach pad (not shown). The second die 508 is electrically connected to the leadframe 502 using wire bonds 511 (block 306). A molding compound 512 forms the package body 505 and encapsulates the inner region of the leadframe 402, the first die 506, the second die 508 and the wire bonds 510, 511 (block 308). Thereafter, solder balls 414 are provided on the leads 504 of the leadframe 502 (block 310). The integrated circuit package 400 represents a single instance that might be concurrently formed in an array fashion and then singulated at the end of the processing, thereby forming the individualized integrated circuit packages (block 312).

Various alternative ways can be used to stack the dies 506 and 508 (as well as possibly additional dies) within the integrated circuit package 500. For example, the approaches or techniques described in U.S. Patent application Ser. No. 10/463,742, filed concurrently herewith, and entitled "INTEGRATED CIRCUIT PACKAGE HAVING STACKED INTEGRATED CIRCUITS AND METHOD THEREFOR", and which is hereby incorporated by reference herein.

In one implementation, the integrated circuit package 500 pertains to a non-volatile memory integrated circuit package. The dies within the integrated circuit package 500 can be of the same function or of different functions. For example, both of the dies can pertain to memory chips, or one of the dies can pertain to a memory chip and the other of the dies can pertain to a controller chip.

Figure 6:
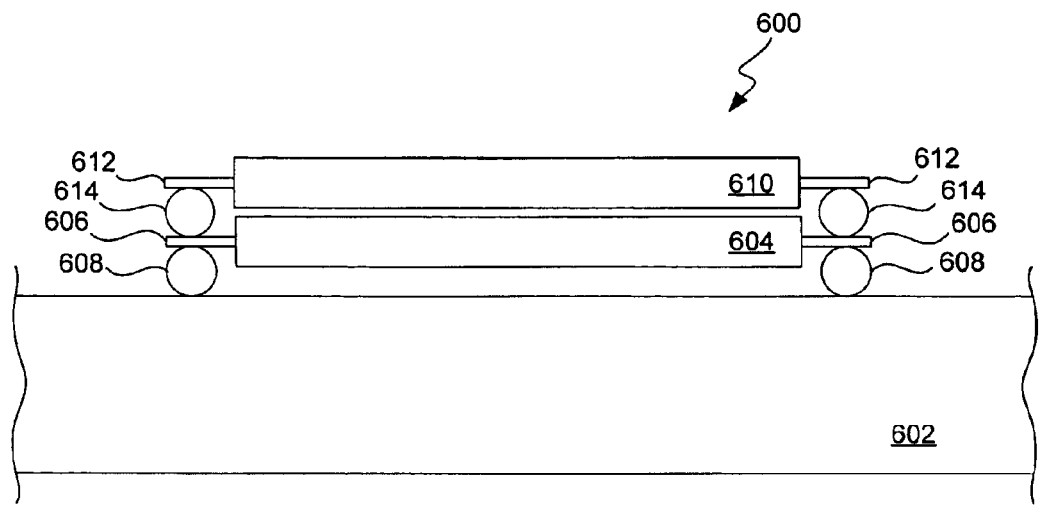
FIG. 6 is a side view of an assembled, stacked arrangement of integrated circuit packages according to one embodiment of the invention.

FIG. 6 is a side view of an assembled, stacked arrangement 600 of integrated circuit packages according to one embodiment of the invention. The integrated circuit packages being stacked are, for example, the integrated circuit packages 200 shown in FIG. 2A. The stacked arrangement 600 forms a stack of integrated circuit packages on a substrate 602. In one embodiment, the substrate 602 is a Printed Circuit Board (PCB). In another embodiment, the substrate 602 is Flex Tape. The top surface of the substrate 602 includes conductive traces that are used to couple to the integrated circuit packages that are placed on the top of the substrate 602.

The stacked arrangement 600 includes a first integrated circuit package 604 that includes first leads 606 and first solder balls 608, and a second integrated circuit package 610 that includes second leads 612 and second solder balls 614. The first leads 606 of the first integrated circuit package 604 couple to the conductive traces of the substrate 602 via the first solder balls 608. The second integrated circuit package 610 is stacked on the first integrated circuit package 604. In this embodiment, the second integrated circuit package 610 has the same physical dimensions (i.e., size) as does the first integrated circuit package 604. When the second integrated circuit package 610 is stacked on the first integrated circuit package 604, the second solder balls 614 are used to connect respective ones of the second leads 612 of the second integrated circuit package 610 to those corresponding first leads 606 of the first integrated circuit package 604. Hence, like leads of the first and second integrated circuit packages 604, 610 are respectively electrically connected to one another by the second solder balls 614 and also connected to the corresponding conductive traces on the substrate 602 via the first solder balls 608.

The stacked arrangement 600 of the integrated circuit packages 604 and 610 with respect to the substrate 602 can be utilized in a variety of different electronic devices. The stacked arrangement 600 is particularly useful when the electronic devices are to remain small, thus the desire to keep the thickness of the stacked integrated circuit packages (as well as the substrate) thin. For example, the electronic device can be a memory card. In the case of a memory card, the first and second integrated circuit chip packages 604 and 610 can be memory chip packages that, when stacked upon one another, provide the ability to double the memory capacity without consuming additional area on the top surface of the substrate 602, yet the height of the stacked integrated circuit packages can remain thin (provided the height of each of the stacked integrated circuit packages is thin).

Figure 7A:
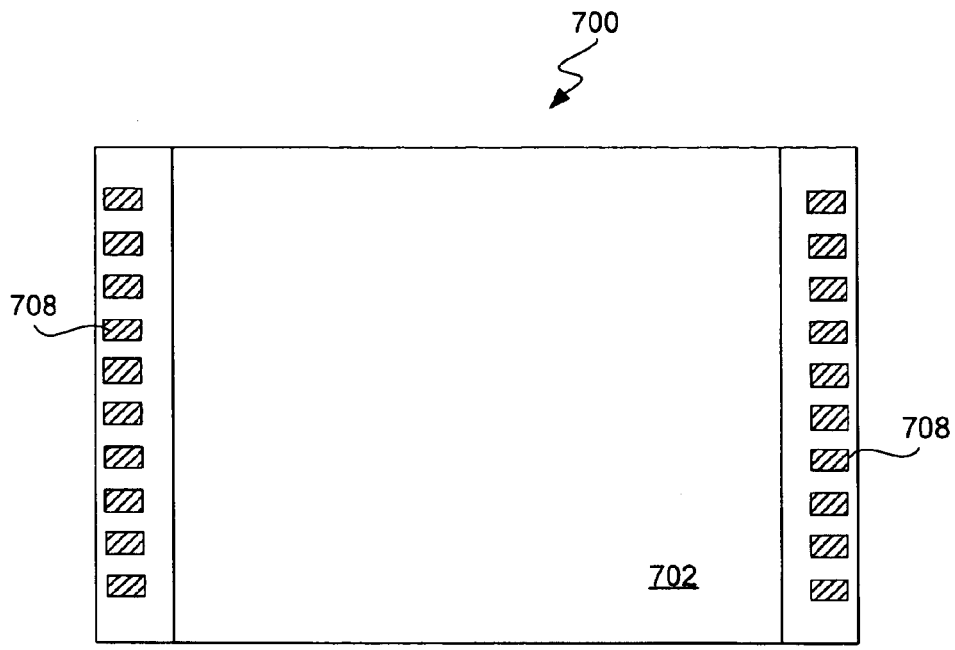
FIG. 7A is a top view of an integrated circuit package according to another embodiment of the invention.
Figure 7B:
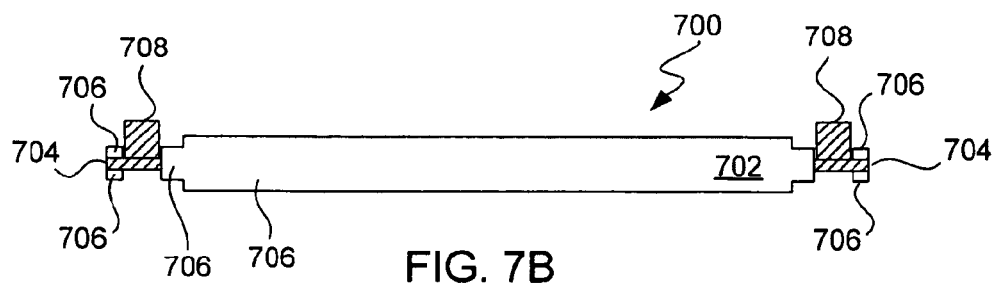
FIG. 7B is a side view of the integrated circuit package illustrated in FIG. 7A.

FIG. 7A is a top view of an integrated circuit package 700 according to another embodiment of the invention. FIG. 7B is a side view of the integrated circuit package 700 illustrated in FIG. 7A. The integrated circuit package 700 represents one embodiment of the integrated circuit package 100, 200 shown in FIGS. 1A, 1B and 2A when the non-solderable regions are formed with a molding compound. The integrated circuit package 700 includes a package housing 702 that has a plurality of conductive leads 704 that extend outward therefrom. However, in this embodiment, the molding compound that forms the package housing 702 is also provided over the non-solderable region of the conductive leads 704. This additional molding compound 706 is typically integral with or contiguous to the package housing 702 and applied simultaneously, so that the additional molding compound 706 is formed when the package housing 702 is formed. In the cases in which the molding compound is initially applied also over the entirety of the conductive leads 704, the molding compound would be removed (such as by an etching process) to expose the solderable region of the conductive leads 704. The thickness of the molding compound over the non-solderable region of the conductive leads 704 can, for example, be about 0.2–0.3 mm. Also, in this embodiment, solder blocks 708 are attached to the solderable region of the conductive leads 704. The solder blocks 708 are able to retain their height as were the solder balls used in other embodiments. The integrated circuit package 700 is stackable, as was the integrated circuit 100.

The solder balls and the solder blocks utilized above are, more generally, solder elements or solder deposits. The geometry of the solder elements or deposits can vary with application. The geometry of the solder elements or deposits can, for example, include at least a ball and a block. It should be understood that those embodiments using solder balls could alternatively use solder blocks, and vice versa. As used herein, the term "solder ball" does not require a pure ball shape. For example, solder balls can be predominately shaped in a circular, spherical, semispherical, or less than semispherical manner.

The integrated circuit packages according to the invention can be used in memory systems. The invention can further pertain to an electronic system that includes a memory system as discussed above. Memory systems are commonly used to store digital data for use with various electronic products. Often the memory system is removable from the electronic system, so the stored digital data is portable. These memory systems can be referred to as memory cards. The memory systems according to the invention can have a relatively small form factor and be used to store digital data for electronic products such as cameras, hand-held or notebook computers, network cards, network appliances, set-top boxes, hand-held or other small audio players/recorders (e.g., MP3 devices), and medical monitors. Examples of memory cards include a PC Card (formerly PCMCIA device), Flash Card, Flash Disk, Multimedia Card, and ATA Card. As an example, the memory cards can use Flash or EEPROM type memory cells to store the data. More generally, a memory system can pertain to not only a memory card but also a memory stick or some other semiconductor memory product.

The advantages of the invention are numerous. Different embodiments or implementations may yield one or more of the following advantages. One advantage of the invention is that thin integrated circuit packages are rendered stackable. Another advantage of the invention is that stackability of integrated circuit packages is available at low cost as no special connectors or modules are needed to stack the integrated circuit packages. Still another advantage of the invention is that high density memory products can be obtained by stacking integrated circuit packages providing memory storage together.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A stackable integrated circuit package, comprising:

a leadframe having an inner region and an outer region, the outer region having a plurality of electrically conductive leads, and each of the conductive leads having a non-solderable region and a solderable region;

at least one die electrically connected to the inner region of said leadframe; and an encapsulant material surrounding at least most of the inner region of said leadframe and said at least one die, thereby forming said stackable integrated circuit package with at least the solderable region of the conductive leads at the outer region of said leadframe being exposed;

wherein each of the conductive leads has a top side and a bottom side; and wherein both the top side and the bottom side of each of the conductive leads have a non-solderable region and a solderable region.

2. A stackable integrated circuit package, comprising:

a leadframe having an inner region and an outer region, the outer region having a plurality of electrically conductive leads, and each of the conductive leads having a non-solderable region and a solderable region;

at least one die electrically connected to the inner region of said leadframe; and an encapsulant material surrounding at least most of the inner region of said leadframe and said at least one die, thereby forming said stackable integrated circuit package with at least the solderable region of the conductive leads at the outer region of said leadframe being exposed;

wherein each of the conductive leads has a top side and a bottom side; and wherein the non-solderable region and the solderable region for each of the conductive leads apply to both the top side and the bottom side of the conductive leads.

3. A stackable integrated circuit package, comprising:

a leadframe having an inner region and an outer region, the outer region having a plurality of electrical conductive leads, and each of the conductive leads having a non-solderable region and a solderable region;

at least one die electrically connected to the inner region of said leadframe; and an encapsulant material surrounding at least most of the inner region of said leadframe and said at least one die, thereby forming said stackable integrated circuit package with at least the solderable region of the conductive leads at the outer region of said leadframe being exposed, wherein the thickness of said integrated circuit package is less than or equal to about 1.5 millimeters.

4. A stackable integrated circuit package as recited in claim 3, wherein said stackable integrated circuit package further comprises at least one solder deposit provided on the solderable region of each of the conductive leads.

5. A stackable integrated circuit package as recited in claim 4, wherein the non-solderable region of each of the conductive leads serves to respectively confine said at least one solder deposit to the solderable region of each of the conductive leads.

6. A stackable integrated circuit package as recited in claim 4, wherein said at least one solder deposits are have a shape of a ball, a sphere, or a portion of a ball or a sphere.

7. A stackable integrated circuit package as recited in claim 4, wherein said integrated circuit package is a leadframe chip scale package.

8. A memory card providing non-volatile data storage, comprising:

a first stackable integrated circuit package having a top surface and a bottom surface, said first stackable integrated circuit package including at least:
  a first leadframe having an inner region and an outer region, the outer region having a plurality of conductive leads, and each of the conductive leads having a non-solderable region and a solderable region;
  at least one die electrically connected to the inner region of said first leadframe;
  an encapsulant material surrounding at least most of the inner region of said first leadframe and said at least one die, thereby forming said first stackable integrated circuit package with at least the solderable region of the conductive leads at the outer region of said first leadframe being exposed; and
  first solder balls provided on the solderable region of each of the conductive leads, a second stackable integrated circuit package having a top surface and a bottom surface, said second stackable integrated circuit package including at least:
  a second leadframe having an inner region and an outer region, the outer region having a plurality of conductive leads, and each of the conductive leads having a non-solderable region and a solderable region;
  at least one die electrically connected to the inner region of said second leadframe;
  an encapsulant material surrounding at least most of the inner region of said leadframe and said at least one die, thereby forming said second stackable integrated circuit package with at least the solderable region of the conductive leads at the outer region of said second leadframe being exposed; and
  second solder balls provided on the solderable region of each of the conductive leads;

wherein said second stackable integrated circuit package is stacked on said first stackable integrated circuit chip, and wherein said second solder balls electrically connect the conductive leads of said second stackable integrated circuit package to corresponding ones of the conductive leads of said first stackable integrated circuit package.

9. A memory card as recited in claim 8,
wherein said memory card further comprises a substrate having signal traces, and
wherein said first solder balls electrically connect the conductive leads of said first stackable integrated circuit package to the signal traces on said substrate.

10. A memory card as recited in claim 8, wherein said first and second stackable integrated circuit chips are of the same size and function.

11. A memory card as recited in claim 8, wherein said first and second stackable integrated circuit chips are identical.

12. A method for forming a stackable integrated circuit package, said method comprising:
  obtaining a metal leadframe having a plurality of conductive leads;
  attaching a first die to an inner region of the metal leadframe;
  electrically connecting the first die to an outer region of the metal leadframe using conductive links;
  encapsulating the first die, the conductive links, and most of the metal leadframe, such that a peripheral portion of the conductive leads at the outer region of the metal leadframe is not encapsulated; and
  attaching a solder deposit to each of the conductive leads at the outer region of the metal leadframe;
  wherein a layer of non-solderable material is provided on the non-solderable region of each of the conductive leads.

13. A method as recited in claim 12, wherein the conductive links are wire bonds.

14. A method as recited in claim 12, wherein the conductive links are solder balls.

15. A method as recited in claim 12, wherein each of the conductive leads has a non-solderable region and a solderable region at the peripheral portion of the conductive leads.

16. A method as recited in claim 15, wherein the non-solderable region of each of the conductive leads is formed during said encapsulating.

17. A method as recited in claim 15, wherein the non-solderable region of each of the conductive leads is formed on the metal leadframe prior to forming said integrated circuit package.

18. A method as recited in claim 12, wherein the non-solderable material is at least one of aluminum, nickel, or copper.

19. A method as recited in claim 12, wherein said method further comprises:
  attaching, prior to said encapsulating, a second die to the first die and electrically connecting the second die to the outer region of the metal leadframe using conductive links.

20. A method as recited in claim 12, wherein the solder deposit to each of the conductive leads has a shape of a ball, a sphere, or a portion of a ball or a sphere.

21. An electronic device as recited in claim 13, wherein said electronic device is a memory card.

22. A method for forming a stackable integrated circuit package, said method comprising:
  obtaining a metal leadframe having a plurality of conductive leads;
  attaching a first die to an inner region of the metal leadframe;

electrically connecting the first die to an outer region of the metal leadframe using conductive links;

encapsulating the first die, the conductive links, and most of the metal leadframe, such that a peripheral portion of the conductive leads at the outer region of the metal leadframe is not encapsulated; and attaching a solder deposit to each of the conductive leads at the outer region of the metal leadframe;

wherein each of the conductive leads has a non-solderable region and a solderable region at the peripheral portion of the conductive leads;

wherein the non-solderable region of each of the conductive leads is formed during said encapsulating;

wherein said encapsulating operates to encapsulate with a molding material; and wherein, during said encapsulating, the molding material placed on the non-solderable region at the peripheral portion of the conductive leads renders such portion of the conductive leads non-solderable.

23. An electronic device, comprising:

a printed circuit board;

a first stackable integrated circuit package having first extended conductive leads, each of the first extended conductive leads having a non-solderable region and a solderable region, and having first solder deposits at the solderable region of each of the first extended conductive leads; and a second stackable integrated circuit package having second extended conductive leads, each of the second extended conductive leads having a non-solderable region and a solderable region, and having second solder deposits at the solderable region of each of the second extended conductive leads;

wherein said first stackable integrated circuit package is mounted on said printed circuit board, and the first solder deposits are used to at least electrically couple the first extended conductive leads of said first stackable integrated circuit package to said printed circuit board; and wherein said second stackable integrated circuit package is stacked on said first stackable integrated circuit package, and the second solder deposits are used to at least electrically couple the second extended conductive leads of said second stackable integrated circuit package to respective ones of the first extended conductive leads of said first stackable integrated circuit package, thereby at least electrically coupling the second extended conductive leads of said second stackable integrated circuit package to said printed circuit board via the first extended conductive leads of said first stackable integrated circuit package.

* * * * *

UNITED STATES PATENT AND TRADEMARK OFFICE
CERTIFICATE OF CORRECTION

| | |
|---|---|
| PATENT NO. | : 6,984,881 B2 |
| APPLICATION NO. | : 10/463051 |
| DATED | : January 10, 2006 |
| INVENTOR(S) | : Hem P. Takiar |

It is certified that error appears in the above-identified patent and that said Letters Patent is hereby corrected as shown below:

Page 2, Col. 2, line 34, under

"Other Publications", "Written Opinion of International Search Authority dated May 24, 2005 re: International Application No. PCT/US0004/018020," should be --Written Opinion of International Search Authority dated May 25, 2005 re: International Application No. PCT/US0004/018020--.

Column 1, lines 37-38, "cost" should be --cost impact of the special connectors or modules is a disadvantage of such stacking--.

Column 6, line 7, change "solder bail" to --solder ball--.

In line 3 of claim 3 (column 10, line 65) change "electrical" to --electrically--.

In line 1 of claim 21 (column 12, line 60) "claim 13" should be --claim 23--.

Signed and Sealed this

Nineteenth Day of September, 2006

JON W. DUDAS
*Director of the United States Patent and Trademark Office*